United States Patent [19]

Tamura

[11] 4,342,966
[45] Aug. 3, 1982

[54] POWER AMPLIFIER CIRCUITRY

[75] Inventor: Eijiro Tamura, Tokyo, Japan

[73] Assignee: Trio Kabushiki Kaisha, Tokyo, Japan

[21] Appl. No.: 174,918

[22] Filed: Aug. 4, 1980

[30] Foreign Application Priority Data

Aug. 31, 1979 [JP] Japan .................. 54/119824[U]

[51] Int. Cl.³ .............................................. H03F 3/30
[52] U.S. Cl. .................................. 330/268; 330/274
[58] Field of Search ................ 330/267, 268, 273, 274

[56] References Cited

U.S. PATENT DOCUMENTS 4,254,379 3/1981 Kawanabe ............................ 330/268

Primary Examiner—James B. Mullins
Attorney, Agent, or Firm—Gerald J. Ferguson, Jr.; Joseph J. Baker

[57] ABSTRACT

In a single-ended push-pull power amplifier circuit having a first transistor of a first driver stage, a second transistor of a first output stage where the first and second transistors are Darlington connected, a third transistor of a second driver stage and a fourth transistor of a second output stage, where the third and fourth transistors are also Darlington connected, first and second resistors are connected between the respective emitters of the first and second transistors and a common output terminal, third and fourth resistors are connected between the respective emitters of the third and fourth transistors and the common output terminal, and a bias circuit for providing a bias voltage of a fixed value between the bases of the first and third transistors, the improvement comprising at least two series circuits of resistors and constant voltage sources for passing the base currents of the second and fourth transistors between (a) the emitter of the first transistor and the emitter of the fourth transistor and (b) the emitter of the third transistor and the emitter of the second transistor respectively.

6 Claims, 7 Drawing Figures

4,342,966

POWER AMPLIFIER CIRCUITRY

CROSS-REFERENCE TO RELATED APPLICATION

This application is related to a U.S. application Ser. No. 158,893 filed by Kazumasa Otao on June 12, 1980 entitled "Improved Power Amplifier Circuitry" and assigned to the assignee of the present application.

BACKGROUND OF THE INVENTION

This invention relates to an improvement in push-pull power amplifier circuitry.

Conventionally, a single-ended push-pull (abbreviated SEPP hereinafter) power circuit, as shown in FIG. 1a, is frequently used as an audio power amplifier circuit. In particular, an SEPP power amplifier circuit which is biased to pass a fixed, small amount of idling current for effective power efficiency is used.

However, in the case of the SEPP power amplifier circuit of FIG. 1a, transistor 1 of the driver stage and transistor 3 of the output stage switch alternately with transistor 2 of the driver stage and transistor 4 of the output stage when a positive or negative half cycle input signal is impressed due to the voltage drops produced at resistors 7 and 8. These resistors are connected between the respective emitters of transistors 3 and 4 of the output stages and the common output terminal C. In particular, the emitter currents $IQ_3$ and $IQ_4$ of output transistors 3 and 4 are alternately cut off as shown in FIG. 1b. As a consequence, switching distortion is produced at load 9 caused by a carrier storage effect, etc. of the transistors, resulting in a shortcoming in that the distortion factor of the power amplifier circuitry deteriorates.

SUMMARY OF THE INVENTION

A primary object of the present invention is to eliminate the above-mentioned shortcoming and to provide an improved power amplifier circuit that does not switch the output transistors during the entire cycle of the input signal and thus does not produce switching distortion.

Other objects and advantages of this invention will be apparent from a reading of the following specification and claims taken with the drawing.

DETAILED DESCRIPTION OF PREFERRED EMBODIMENTS OF THE INVENTION

Figure 1A:
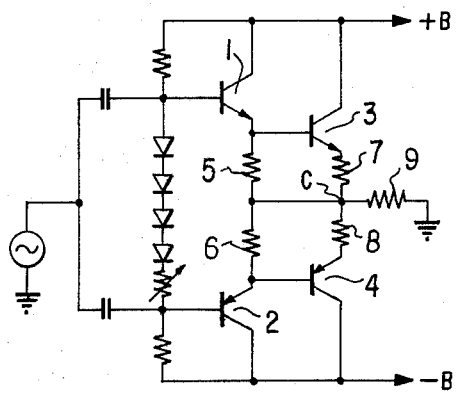
FIGS. 1a and 1b are, respectively, a circuit diagram and the emitter current waveforms of the output transistors of a conventional power amplifier circuit.
Figure 1B:
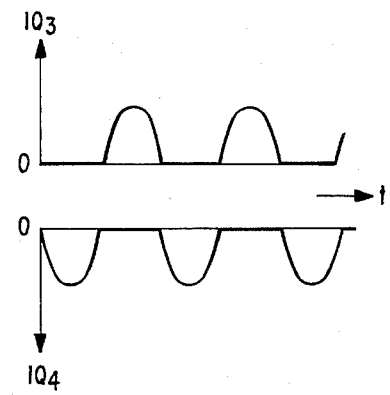

Reference should be made to the drawing where like reference numerals refer to like parts.

Figure 2A:
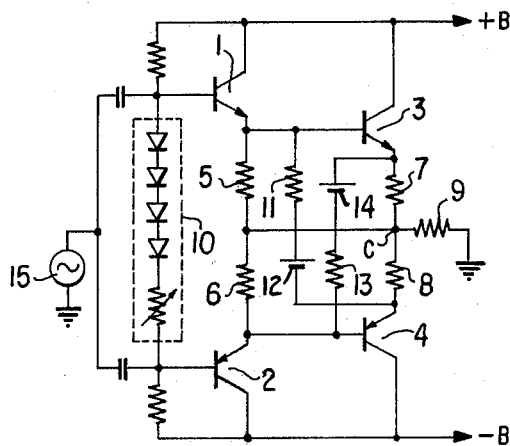
FIGS. 2a and 2b are a circuit diagram and emitter current waveforms of the output transistors of an illustrative power amplifier circuit in accordance with the invention.

FIG. 2a is a circuit diagram of one embodiment of this invention. Transistor 1 of the driver stage and transistor 3 of the output stage are in Darlington connection and comprise an emitter follower in which resistors 5 and 7 are connected between the respective emitters of transistors 1 and 3 and the common output terminal C. Transistor 2 of the driver stage and transistor 4 of the output stage are also in Darlington connection and comprise an emitter follower in which resistors 6 and 8 are connected between the respective emitters of transistors 2 and 4 and the common output terminal C. Bias circuit 10, which provides a fixed voltage so that transistors 1 and 2 of the driver stages and transistors 3 and 4 of the output stages are not cut off during the no-input signal time, is connected between the bases of transistors 1 and 2 to configure the SEPP power amplifier circuit between the positive power supply +B and the negative power supply −B.

Further, in accordance with the invention, a series circuit of a resistor 11 and a constant voltage source 12 is connected between the emitter of transistor 1 and the emitter of transistor 4 and a series circuit of a resistor 13 and a constant voltage source 14 is connected between the emitter of transistor 2 and the emitter of transistor 3. The constant voltage source 12 is connected at its positive side to the emitter side of transistor 1 while the constant voltage source 14 is connected at its negative side to the emitter side of transistor 2 so that a positive current is supplied from constant voltage source 12 across resistor 11 to resistor 5 and the base of transistor 3 while a negative current is supplied from constant voltage source 14 across resistor 13 to resistor 6 and the base of transistor 4. Also 9 is the load and 15 is the input signal source.

During no-input signal time in the foregoing power amplifier, a part of the emitter current of transistor 1 and a part of the current supplied through resistor 11 are injected into the base of transistor 3 because of the voltage of bias circuit 10 and the voltage of the constant voltage source 12 so that transistor 3 is biased. Similarly, a part of the emitter current of transistor 2 and a part of the current supplied from resistor 13 (these currents are negative currents) are injected into the base of transistor 4 because of the voltage of bias circuit 10 and the voltage of the constant voltage source 14 so that transistor 4 is biased. As a consequence, transistors 1 and 2 and transistors 3 and 4 are not cut off during the no-input signal time, but remain in a state of prescribed current flow.

Figure 2B:
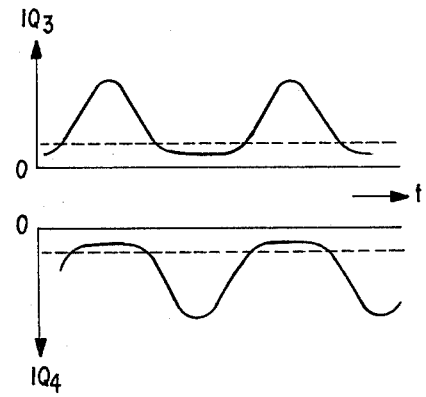

Next, when the input signal source 15 excites the negative side or, in other words, when the negative half cycle of an input signal is applied to the power amplifier circuit, the base potentials of transistors 1 and 2 shift from the no-input signal state to the negative side so that transistors 2 and 4 amplify the input signal and generate power at load 9. The emitter current of transistor 4 increased by this input signal flows to resistor 8 and load 9 and causes the voltage drop produced at resister 8 to increase. Transistor 1 changes to a cut-off state due to the increased voltage drop at resistor 8. However, since current from constant voltage source 12 flows constantly across resistor 11 to the base of transistor 3, transistor 3 does not change to a cut-off state. At this time, the current flowing through resistor 11 decreases further according to the value of the voltage drop at resistor 8. The base current of transistor 3 also decreases, changing as if it were demodulated by the value of the voltage drop at resitor 8 so that the emitter current $IQ_3$ of transistor 3 appears as shown by the solid line at the top of FIG. 2b. In other words, the emitter current of transistor 3 changes smoothly from the period in which transistor 3 contributes to the amplifying action to the period when it does not contribute to the amplifying action.

Further, when the input signal source 15 applies the positive half cycle of the input signal to the power amplifier circuit, the base potentials of transistors 1 and 2 shift from the no-input signal state to the positive side so that transistors 1 and 3 amplify the input signal and generate power at load 9. The emitter current of transistor 3 for the output stage increased by this input signal flows to resistor 7 and load 9 and causes the voltage drop produced at resistor 7 to increase. Transistor 2 for the driver stage changes to a cut-off state due to the increased voltage drop at resistor 7. However, since current flows constantly to the base of transistor 4 from constant voltage source 14 and resistor 13, transistor 4 does not change to a cut-off state. At this time, the current flowing through resistor 13 decreases further according to the value of the voltage drop at resistor 7. The base current of transistor 4 also decreases, changing as if it were demodulated by the value of the voltage drop at resistor 7 so that the emitter current $IQ_4$ of transistor 4 appears as shown by the solid line at the bottom of FIG. 2b. In other words, the emitter current of transistor 4 changes smoothly from the period in which transistor 4 contributes to the amplifying action to the period when it does not contribute to the amplifying action.

As stated above, since transistors 3 and 4 do not change to a cut-off state even during the period when they are not contributing to the amplifying action and thus do not switch, switching distortion does not develop. Further, the emitter currents of output transistors 3 and 4 do not change suddenly even at the switching times of the positive and negative half cycle periods of the input signals. Thus, since the current waveform changes smoothly, the top-to-bottom waveform continuity in FIG. 2b becomes smooth and crossover distortion is also improved. This effect is noted as a rounding effect hereafter.

In addition, in the circuit of resistor 11 and constant voltage source 12 and the circuit of resistor 13 and constant voltage source 14, when the emitter currents of transistors 3 and 4 increase due to a temperature rise, the currents flowing to resistors 11 and 13 due to the voltage drop at resistors 7 and 8 decrease and act toward reducing the emitter currents of the output stages. Thus, there is a temperature compensation effect as well. A temperature compensating circuit using a varistor, etc. is used for bias circuit 10 as is known.

Figure 3:
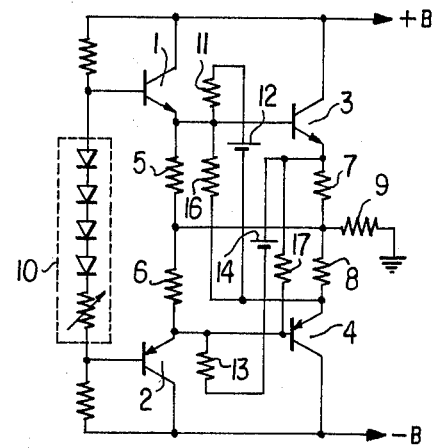
FIGS. 3, 4 and 5 are circuit diagrams of illustrative power amplifier circuits in accordance with first, second, and third further embodiments of the invention

FIG. 3 is a circuit diagram of a first modified embodiment of this invention. Added to the power amplifier circuit shown in FIG. 2a are a resistor 16 connected between the emitter of transistor 1 and the emitter of transistor 4 and a resistor 17 connected between the emitter of transistor 2 and the emitter of transistor 3.

This modified, power amplifier circuit operates the same as the FIG. 2a circuit, as described above. In addition, the voltage drops at resitors 7 and 8 are fed back to the bases of transistors 3 and 4 through resistors 16 and 17 respectively, resulting in a further improved rounding effect.

Figure 4:
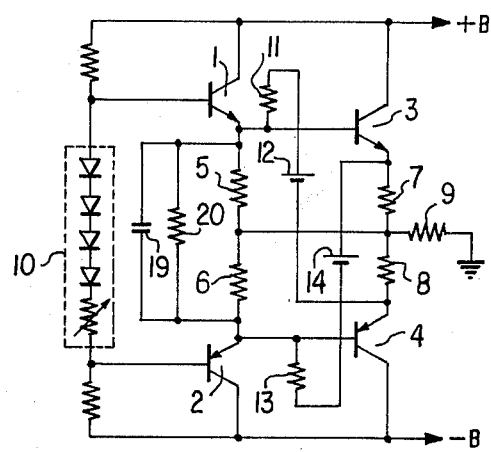

FIG. 4 is a circuit diagram of a second modified embodiment of this invention. Added to the power amplifier circuit shown in FIG. 2a is a parallel circuit consisting of a capacitor 19 and a resistor 20 connected between the emitters of transistors 1 and 2 for the driver stages.

This modified, power amplifier circuit operates the same as the FIG. 2a circuit, as described above. In addition, the rounding effect is further improved by the time constant determined by resistor 20 and capacitor 19.

Figure 5:
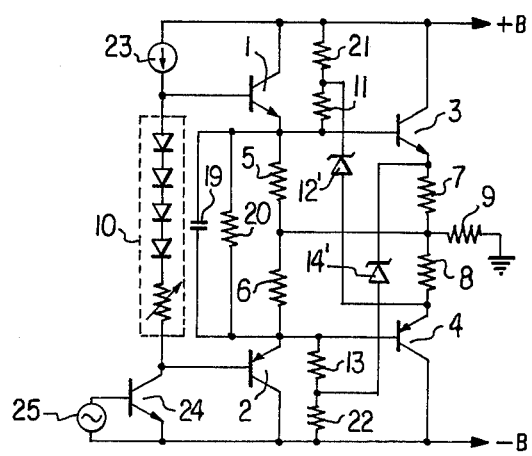

A third embodiment of the invention will now be described with respect to FIG. 5 in which the constant voltage sources 12 and 14 are comprised of Zener diodes. Referring to the power amplifier circuits shown in FIGS. 4 and 5, Zener diodes 12' and 14' are respectively employed in FIG. 5 instead of the constant voltage sources 12 and 14 of FIG. 4. Further, a resistor 21 is connected between the common connection point of resistor 11 and the cathode of the Zener diode 12' and the positive power supply +B while a resistor 22 is connected between the common connection point of resistor 13 and the anode of Zener diode 14' and the negative power supply −B. Also in FIG. 5, transistor 24 is a transistor which comprises a voltage amplifying stage having a constant current load 23, and 25 is the input signal source.

Thus, Zener diode 12' and resistor 21 correspond to and operate the same as a constant voltage source 12 while Zener diode 14' and resistor 22 correspond to and operate the same as a constant voltage source 14. Thus, the power amplifier circuit of FIG. 5 performs and operates the same as the power amplifier circuit of FIG. 4.

As explained above, when this invention is used, the transistors for the output stages do not change to a complete cut-off state even during the period when they are not contributing to the amplifying action. Thus, the transistors for the output stage do not switch, and switching distortion is eliminated from the power amplifier circuit. Further, there is an additional merit in that the circuit configuration is also extremely simple. Also, the shifting of the emitter currents of the transistors for the output stages is also smooth at the switching time between the period contributing to the amplifying action and the non-contributory period. In addition, temperature compensation is also accomplished resulting in very stable amplifying action.

It is to be understood that the above detailed description of the various embodiments of the invention is provided by way of example only. Various details of design and construction may be modified without departing from the true spirit and scope of the invention as set forth in the appended claims.

What is claimed is:

1. In a single-ended push-pull power amplifier circuit having a first transistor of a first driver stage, a second transistor of a first output stage where the first and second transistors are Darlington connected, a third transistor of a second driver stage and a fourth transistor of a second output stage where the third and fourth transistors are also Darlington connected, first and second resistors are connected between the respective emitters of the first and second transistors and a common output terminal, third and fourth resistors are connected between the respective emitters of the third and fourth transistors and the common output terminal, and a bias circuit for providing a bias voltage of a fixed value between the bases of the first and third transistors, the improvement comprising at least two series circuits of resistors and constant voltage sources for passing the base currents of the second and fourth transistors between (a) the emitter of the first transistor and the emitter of the fourth transistor and (b) the emitter of the third transistor and the emitter of the second transistor respectively.

2. The improvement as in claim 1 where said two series circuits comprise (a) a fifth resistor and a first constant voltage source connected between the emitters of the first and fourth transistors and (b) a sixth resistor and a second constant voltage source connected between the emitters of the second and third transistors.

3. the improvement as in claim 2 where said constant voltage sources each comprise a battery.

4. The improvement as in claim 2 including first and second power supplies of opposite polarity and seventh and eighth resistors and where the first and second constant voltage sources respectively comprise first and second Zener diodes and said seventh and eighth resistors and said first and second power supplies where said seventh resistor is connected between the first power supply and the common connection point of said fifth resistor and the first Zener diode and said eighth resistor is connected between the second power supply and the common connection point of said sixth resistor and the second Zener diode.

5. The improvement as in claims 1 or 2 including two further resistors respectively connected in parallel with said two series circuits.

6. The improvement as in claims 1 or 2 including a parallel resistor and capacitor circuit connected between the emitters of said first and third transistors.

* * * * *